United States Patent
Schmandt

(10) Patent No.: US 7,289,542 B2
(45) Date of Patent: Oct. 30, 2007

(54) METHOD FOR OPERATING A PLL FREQUENCY SYNTHESIS CIRCUIT

(75) Inventor: Bernd Schmandt, Wuppertal (DE)

(73) Assignee: Infineon Technologies AG, Munich (DE)

( * ) Notice: Subject to any disclaimer, the term of this patent is extended or adjusted under 35 U.S.C. 154(b) by 978 days.

(21) Appl. No.: 10/624,955

(22) Filed: Jul. 22, 2003

(65) Prior Publication Data

US 2004/0156465 A1   Aug. 12, 2004

Related U.S. Application Data

(63) Continuation of application No. PCT/DE02/00171, filed on Jan. 21, 2002.

(30) Foreign Application Priority Data

Jan. 22, 2001   (DE) ................ 101 02 725

(51) Int. Cl.
*H04J 3/06* (2006.01)
*H03D 3/24* (2006.01)
*H04B 7/00* (2006.01)

(52) U.S. Cl. ............ 370/516; 370/335; 375/376; 455/260; 377/37

(58) Field of Classification Search ........... 370/335, 370/516; 377/37–48; 375/346, 376; 455/260, 455/255
See application file for complete search history.

(56) References Cited

U.S. PATENT DOCUMENTS

| 5,598,405 A | | 1/1997 | Hirose |
| 5,729,179 A | * | 3/1998 | Sumi .................. 331/12 |
| 6,288,614 B1 | | 9/2001 | Linss |

FOREIGN PATENT DOCUMENTS

| DE | 196 11 219 A1 | 9/1997 |
| DE | 197 36 463 A1 | 3/1999 |
| DE | 197 36 464 A1 | 3/1999 |
| DE | 197 48 885 A1 | 5/1999 |
| DE | 198 37 204 A1 | 3/2000 |
| DE | 199 29 167 A1 | 12/2000 |
| EP | 0 499 245 A2 | 8/1992 |
| EP | 0499 245 A2 * | 8/1992 |

* cited by examiner

*Primary Examiner*—Afsar Qureshi
(74) *Attorney, Agent, or Firm*—Laurence A. Greenberg; Werner H. Stemer; Ralph E. Locher

(57) ABSTRACT

In a method for operating a PLL frequency synthesis circuit, the circuit is in an active state and synthesizes a first output frequency during a first data transmission period. The circuit is likewise active and synthesizes a second, different output frequency during a later, second data transmission period. The PLL frequency synthesis circuit is first reprogrammed to an intermediate frequency, and is controlled from there to the second output frequency, in an intermediate time period.

5 Claims, 1 Drawing Sheet

METHOD FOR OPERATING A PLL FREQUENCY SYNTHESIS CIRCUIT

CROSS-REFERENCE TO RELATED APPLICATION

This application is a continuation of copending International Application No. PCT/DE02/00171, filed Jan. 21, 2002, which designated the United States and was not published in English.

BACKGROUND OF THE INVENTION

Field of the Invention

The invention relates to a method for operating a PLL frequency synthesis circuit for a TDMA/FDMA data transmission device.

Time division multiple access (TDMA) methods and frequency division multiple access (FDMA) methods are multiple access methods that are used in a large number of data transmission systems (cordless telephony, data interchange between computers and peripherals, etc.). TDMA is based on the subdivision of the time into time slots, which are then used for interchanging data in portions between terminals (for example base stations and mobile stations). FDMA is analogous to TDMA in the frequency domain, that is to say it relates to the subdivision of the overall transmission bandwidth into individual user channels, which are available to two or more users for simultaneous data transmission.

Frequency hopping (FH) methods, are characterized in that the transmission frequency (that is to say the user channel) for each transmitter is changed continually during transmission operation. FH decreases the interference susceptibility because it guarantees that transmission only ever takes place for a short time via individual channels that are subject to severe interference, and can therefore be kept within certain limits.

A phase locked loop (PLL) frequency synthesizer is used to produce the transmission frequency in data transmission systems. A certain amount of time is required for the frequency changes that are required for the FH method, owing to the stabilization processes in the PLL. This time is referred to in the following text as the settle time. Since the settle time cannot be used for data transmission, it should be kept as short as possible.

The normal method for shortening the settle time in the PLL is to widen the transmission bandwidth of the PLL. This has the disadvantage that the noise response of the PLL becomes worse. Phase locked loops with short settle times and low noise are relatively complex, and cannot be used for many applications, for cost reasons.

One known method for operating a PLL frequency synthesizer for a frequency change is to deactivate the PLL for the frequency synthesizer after transmitting the last transmitted data burst or data packet. This is done by switching off the voltage controlled oscillator for the PLL. The PLL frequency synthesizer is then set to the next desired frequency value, and is activated once again for transmission of the next data burst. The next data burst is transmitted after the stabilization process.

Published, Non-Prosecuted German Application DE 197 36 463 A1, which represents the closest prior art, describes a method for operating a phase locked loop, in which the phase locked loop is deactivated in a time period without transmission activity. This procedure is also addressed in Published, Non-Prosecuted German Application DE 197 36 464 A1.

Published, Non-Prosecuted German Application DE 196 11 219 A1 describes a phase locked loop with a loop filter having a switchable loop bandwidth. Switching the loop bandwidth shortens the time interval that is required for a stabilization process between two transmission processes.

SUMMARY OF THE INVENTION

It is accordingly an object of the invention to provide a method for operating a PLL frequency synthesis circuit that overcomes the above-mentioned disadvantages of the prior art methods of this general type, which allows short settle times for the PLL frequency synthesis circuit during frequency changing.

With the foregoing and other objects in view there is provided, in accordance with the invention, a method for operating a PLL frequency synthesis circuit for a TDMA/FDMA data transmission device. The method includes operating the PLL frequency synthesis circuit in an active state for transmitting data during a first period using a first output frequency synthesized by the PLL frequency synthesis circuit. No data transmission activity is carried out by the TDMA/FDMA data transmission device during an intermediate period following the first period. The PLL frequency synthesis circuit is reprogrammed from the first output frequency to a stabilization basic frequency, located in a suitable manner in a usable frequency band, after the first period has elapsed from which a stabilization process to a second output frequency is carried out. The PLL frequency synthesis circuit is operated for transmitting further data during a second period using the second output frequency, not being equivalent to the first output frequency, following the intermediate period, the PLL frequency synthesis circuit synthesizing the second output frequency.

Accordingly, the idea on which the invention is based is for the PLL frequency synthesis circuit not to be deactivated during a frequency change, but to be kept in the active state and for the stabilization process to be carried out from the active state to the next output frequency. Provision is in this case made for the PLL frequency synthesis circuit to be reprogrammed, after the first period of data transmission activity has ended, to a stabilization basic frequency, which is located in a suitable manner in the usable frequency band, and then to be changed from the stabilization basic frequency to the second output frequency.

Stabilization processes admittedly also occur here; however, owing to the comparatively narrow bandwidth of the usable frequency band, these are shorter than in the case of conventional methods and—as will be explained in the following text—are less influenced by production tolerances.

The method according to the invention is particularly advantageous when the next output frequency is not yet known after the first period with data transmission activity has ended.

Since the mid-frequency of the frequency band that is used for FDMA operation is chosen for the stabilization basic frequency, this results in that the greatest sudden frequency change that need be expected is minimal. Since the settle time that is required for the frequency change increases with the separation between the stabilization basic frequency and the second output frequency, this results in that it is possible to specify an upper limit with a minimum size for the settle time with respect to all the possible frequency changes in the FDMA frequency band.

One particular advantage is achieved by the method according to the invention if the data transmission is based on a TDMA structure in which the start of a specific time slot coincides with the start of the first data transmission period, and the start of the next time slot coincides with the start of the second data transmission period, and with the time period between the end of the first data transmission period and the start of the second data transmission period being shorter than that settle time of the PLL frequency synthesis circuit which would occur if the PLL frequency synthesis circuit were to be controlled from the deactivated state to the second output frequency. In this situation, the procedure according to the invention results in that a frequency change is still possible in the remaining time period of the time slot under consideration while, in the case of a conventional method, the frequency change must be carried out at a later time. In practice, for example in the case of digital European cordless telecommunications (DECT) systems, a dedicated time slot with a duration of 416 us is frequently used for the frequency change, particularly because this makes it possible to use lower-cost PLLs with longer settle times. The method according to the invention for operating a PLL frequency synthesis circuit may make it possible to once again save this additionally required time slot.

In accordance with an added mode of the invention, there is the step of transmitting the data using a Bluetooth standard or the DECT standard.

Other features which are considered as characteristic for the invention are set forth in the appended claims.

Although the invention is illustrated and described herein as embodied in a method for operating a PLL frequency synthesis circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
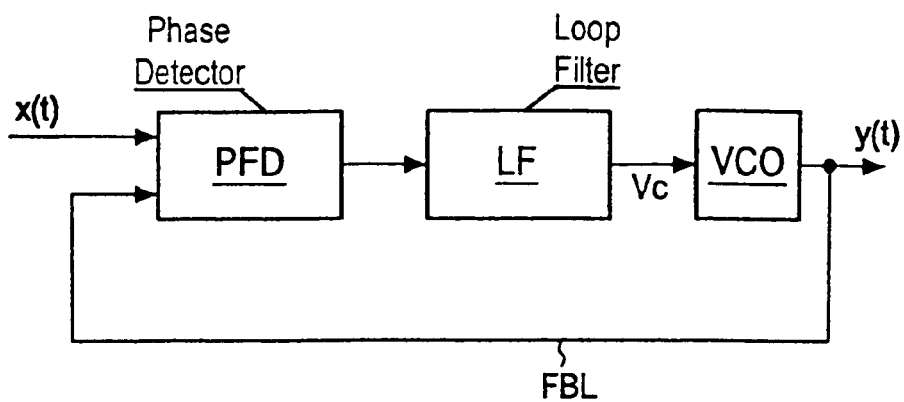
FIG. 1 is a block diagram of a PLL circuit according to the invention.

Referring now to the figures of the drawing in detail and first, particularly, to FIG. 1 thereof, there is shown a basic configuration of a PLL circuit. The PLL circuit has a phase detector PFD (Phase Frequency Detector), a loop filter LF and a voltage controlled oscillator VCO. The VCO produces a periodic oscillation y(t) which is fed back via a feedback line FBL (Feedback Loop) to a first input of the phase detector PFD. A second input of the phase detector PFD is supplied with a reference variable x(t) in the form of an oscillation. A variable t denotes the time.

The object of the PLL circuit is to allow the time response of the output variable y(t) to follow the input variable x(t). In other words, the frequency of the voltage controlled oscillator VCO should be set such that it matches the frequency of the oscillation x(t). To do this, the phase of the output signal y(t) is compared with the phase of the reference variable x(t). The phase detector PFD outputs an output signal that represents a measure of the determined phase difference between the two variables. After low-pass filtering, the phase difference signal is used in the loop filter LF to control the oscillator VCO. The loop filter LF smoothes the phase difference signal.

Owing to the inertia of the control system, the output variable y(t) cannot immediately follow a sudden change in the reference variable x(t). The time which is required to reduce the frequency error between x(t) and y(t) to a desired level is referred to as the settle time, and will be considered in more detail in the following text.

The control principle explained with reference to FIG. 1 is used in a PLL frequency synthesizer. PLL frequency synthesizers are used in data transmission devices. Their object is to generate a desired carrier frequency Fout from a constant reference frequency Fref, with the carrier frequency Fout being several orders of magnitude above the reference frequency. The capability of the PLL frequency synthesizer to change between different output frequencies Fout as quickly as possible is of major importance in this case. Rapid changes between different output frequencies (user channels) are of particular importance for data transmission devices for mobile and/or cordless telephony since, in these applications, a large number of user channels and the FH method are regularly used.

Transmission standards such as DECT or—recently—Bluetooth have been developed for data transmission systems such as these, and these standards are based on frequency hopping (FH). In the case of FH, each logical channel (that is to say subscriber) is allocated a physical channel (that is to say a specific user frequency) for only a specific, short time. Once this time has elapsed, a frequency change must be carried out. Therefore, the transmission frequency (and reception frequency) are changed continually throughout transmission operation (and reception operation).

Figure 2:
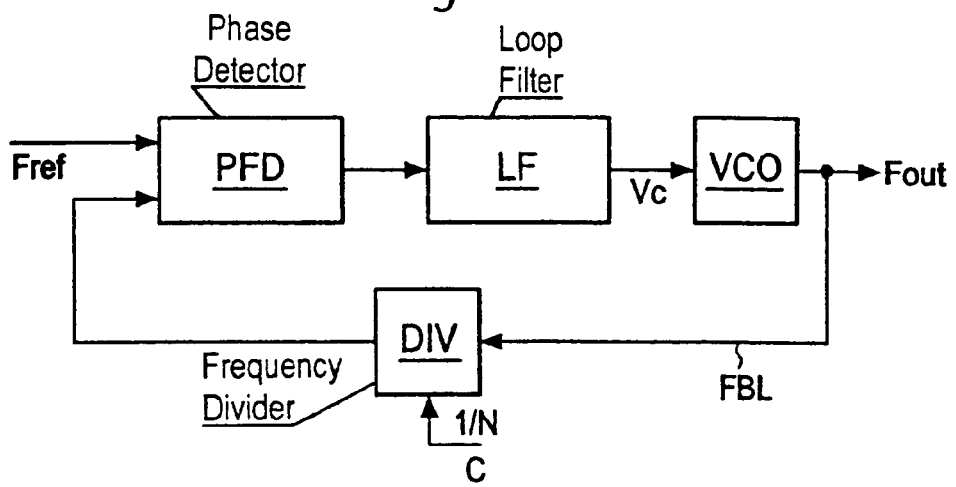
FIG. 2 is a block diagram of a PLL frequency synthesis circuit.

FIG. 2 shows a block diagram of a PLL frequency synthesizer that is suitable for carrying out the method according to the invention. The PLL frequency synthesizer has a PLL circuit as shown in FIG. 1, in whose feedback line FBL a programmable frequency divider DIV is provided. The programmable frequency divider DIV is supplied with a control signal C, which indicates to the frequency divider DIV that it should carry out a frequency division by the division factor 1/N. Different output frequencies Fout are then produced by repeatedly reprogramming the frequency divider DIV.

In the case of DECT, the carrier frequencies are in a frequency band between 1880 and 1900 MHz. The constant reference frequency Fref is derived from a crystal oscillator and is, for example, 5 MHz. In consequence, in the case of DECT, frequency division is carried out in the range between 1/376 and 1/380 (N may in this case also not be an integer or, in order to achieve suitable frequency division, a further frequency divider (not shown) with a fixed division ratio may be disposed between the crystal oscillator and the phase detector PFD).

As already mentioned, the VCO is the element that produces the oscillation for the PLL frequency synthesizer. The output frequency Fout from the VCO is obtained, in the simplest case, from a linear function in accordance with the following equation:

$$Fout = Ffree + Kvco \times Vc.$$

In this case, Ffree is the frequency of the free-running oscillator VCO, Kvco is the voltage/frequency "gain" of the oscillator VCO, and Vc is the control voltage which influences the output frequency Fout of the oscillator VCO.

In the case of a TDMA data transmission system, the data is transmitted in portions, in what are referred to as bursts or else data packets. For the sake of simplicity, the following text generally uses the expression data bursts, even when data packets are meant.

Depending on the data transmission system under consideration, either two or more data bursts or (a maximum of) one data burst are or is transmitted in one TDMA time slot. In the case of packet transmission, it is also possible for the transmission of one data packet to extend over two or more time slots. The FH times are likewise controlled differently depending on the standard under consideration. For example, in the Bluetooth Standard, two frequency hops can occur, and two data packets can be transmitted, in one time slot with a length of 625 us. The FH frequency change times and the TDMA time slot structure are, however, always matched to one another in time, that is to say they are commensurable. In many cases, short PLL settle times are therefore extremely helpful, for example in order to make it possible to optimally use a predetermined time slot structure for a predetermined burst length, or in order to make it possible still to achieve a predetermined minimum FH hopping frequency rate with a predetermined burst length.

This will be explained in the following text with reference to an example.

Figure 3:
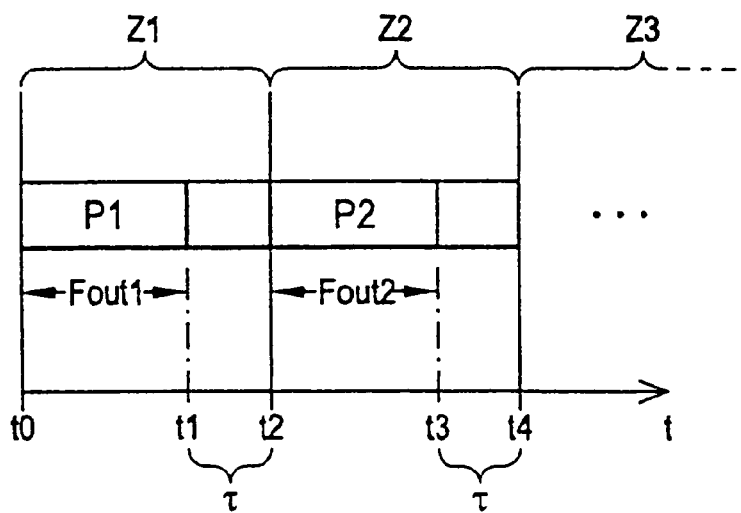
FIG. 3 is a schematic illustration of a time slot structure used in a data transmission system, and the timings of operating states of the PLL frequency synthesis circuit within the time slot structure.

FIG. 3 shows two successive time slots Z1 and Z2. The time slot Z1 starts at t0 and lasts until t2, and the second time slot Z2 starts at t2 and lasts until t4.

Both time slots Z1 and Z2 are used for data transmission. A first burst P1 is transmitted in a time interval from t0 to t1 in the time slot Z1. No data transmission takes place in the time interval from t1 to t2, whose length is τ. A second data burst P2 is transmitted in the time interval from t2 to t3. The remaining time interval t3 to t4, with the length τ of the second time slot Z2, once again has no data transmission activity.

In the example, it is assumed that the first data burst P1 is transmitted at a frequency Fout1, and that a different frequency Fout2 is provided for transmitting the second data burst. Therefore, the PLL frequency synthesizer illustrated in FIG. 2 must change from the first output frequency Fout1 to the second output frequency Fout2 in order to transmit the second data burst P2.

In the conventional method, the PLL synthesizer is for this purpose switched off after each transmission of a data burst P1, P2, that is to say at the times t1 and t3. The reason for switching it off is to save power during the time periods t1 to t2 and t3 to t4, in which no data transmission activity takes place. Once the PLL frequency synthesizer has been switched off, the programmable frequency divider DIV is then reprogrammed to the desired value for the second output frequency Fout2, and the PLL frequency synthesizer is activated once again.

Provided that τ is sufficiently long, no problems occur during this process. However, difficulties occur for short times of τ.

This is because, when the oscillator VCO is switched on once again, it first starts to oscillate at the free-running frequency Ffree. The free-running frequency Ffree cannot be set exactly, owing to manufacturing tolerances. A situation therefore occurs in practice in which the free-running frequency Ffree is not located within the intended FDMA frequency band. In this situation, the control delay for the PLL lengthens the overall time that is required for the stabilization process from the deactivated state to the desired output frequency Fout2.

In order to make it possible to carry out a frequency change in a shorter time, the invention provides for the voltage controlled oscillator VCO not to be deactivated after handling the previous data burst P1 but to be set to a different suitable frequency in the frequency band, in particular to its mid-frequency, and to be reprogrammed from there to the desired frequency Fout2. The stabilization process then takes place from Fout1 via the suitable frequency to Fout2, and is faster than in the case of conventional methods.

Particularly in situations where the intended frequency Fout2 is not yet known at the time t1, the method according to the invention makes it possible to change to the second output frequency Fout2 in a very short time, as soon as the new frequency information is provided for the PLL frequency synthesizer.

It should be mentioned that the invention makes it possible to increase the information transmission rate in certain circumstances. This is the situation when, in the case of a conventional procedure (deactivation of the VCO after each data burst transmission), the remaining time τ before the start of the next time slot Z2 is no longer sufficient, with correspondingly short dimensioning of the time slot structure, for the PLL frequency synthesizer to be stabilized (output frequency: Fout2) by the time t2. In this situation, the data burst P2 cannot be transmitted in the time slot Z2, and the transmission of the data burst P2 must be delayed to the next time slot Z3, or to an even later time slot. The shortening of the settle time which is achieved by the method according to the invention makes it possible in a situation such as this for the stabilization process possibly still to be completed in good time at the time t2, so that the data burst P2 is still transmitted in the second time slot Z2. To this extent, it is also possible to provide for the method according to the invention to be used as the operating mode only at times, namely when a high data rate is required, and in other cases to operate the PLL in the conventional operating mode, with the PLL being switched off between activity periods.

I claim:

1. A method for operating a PLL frequency synthesis circuit for a TDMA/FDMA data transmission device, which comprises the steps of:

operating the PLL frequency synthesis circuit in an active state for transmitting data during a first period using a first output frequency synthesized by the PLL frequency synthesis circuit;

carrying out no data transmission activity by the TDMA/FDMA data transmission device during an intermediate period following the first period;

reprogramming the PLL frequency synthesis circuit from the first output frequency to a stabilization basic frequency, located in a suitable manner in a usable frequency band, after the first period has elapsed from which a stabilization process to a second output frequency being carried out; and operating the PLL frequency synthesis circuit to transmit further data during a second period using the second output frequency, not being equivalent to the first output frequency, following the intermediate period, the PLL frequency synthesis circuit synthesizing the second output frequency.

2. The method according to claim 1, which further comprises providing the stabilization basic frequency as a mid-frequency of the useable frequency band for an FDMA operation.

3. The method according to claim 1, which further comprises basing a data transmission on a TDMA structure, in which a start of a specific time slot coincides with a start of the first period, and a start of a next time slot coincides with a start of the second period, and with a time period between an end of the first period and the start of the second period being shorter than a settle time of the PLL frequency synthesis circuit which would occur if the PLL frequency synthesis circuit were to be controlled from a deactivated state to the second output frequency.

4. The method according to claim 1, which further comprises transmitting the data and the further data in accordance with a Bluetooth Standard.

5. The method according to claim 1, which further comprises transmitting the data and the further data in accordance with a DECT Standard.

* * * * *